(12) United States Patent
Watanabe et al.

(10) Patent No.: US 10,504,868 B2
(45) Date of Patent: Dec. 10, 2019

(54) SOLDER JOINING

(71) Applicant: FUJI ELECTRIC CO., LTD., Kawasaki (JP)

(72) Inventors: Hirohiko Watanabe, Hachioji (JP); Shunsuke Saito, Hachioji (JP); Yoshihiro Kodaira, Shenzhen (CN)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/994,797

(22) Filed: May 31, 2018

(65) Prior Publication Data

US 2018/0277506 A1    Sep. 27, 2018

Related U.S. Application Data

(63) Continuation of application No. PCT/JP2017/017659, filed on May 10, 2017.

(30) Foreign Application Priority Data

Jun. 16, 2016   (JP) .................................. 2016-119970

(51) Int. Cl.
*B23K 1/00* (2006.01)
*H01L 21/00* (2006.01)
(Continued)

(52) U.S. Cl.
CPC .......... *H01L 24/29* (2013.01); *B23K 35/0238* (2013.01); *B23K 35/26* (2013.01);
(Continued)

(58) Field of Classification Search
CPC ............... B23K 35/262; B23K 1/0016; B23K 2101/36; B23K 35/0244; B23K 2101/40;
(Continued)

(56) References Cited

U.S. PATENT DOCUMENTS 8,598,707 B2 * 12/2013 Maeda ................. B23K 1/0016
257/772
8,779,587 B2 * 7/2014 Bachman ................ H01L 24/11
257/737

(Continued)

FOREIGN PATENT DOCUMENTS

JP    7-284983      10/1995
JP    2001-35978    2/2001
(Continued)

OTHER PUBLICATIONS

International Search Report dated Aug. 15, 2017 in corresponding International Patent Application No. PCT/JP2017/017659.

*Primary Examiner* — Erin B Saad

(57) ABSTRACT

The present invention suppresses fracture at an interface between different materials, and provides a solder joining which includes: a solder joining layer 10 having a melted solder material, containing Sb at more than 5.0% by mass and 10.0% by mass or less, Ag at 2.0 to 4.0% by mass, Ni at more than 0 and 1.0% by mass or less, and a balance made up of Sn and inevitable impurities; and joining members 11 and 123 at least one of which is a Cu or Cu-alloy member 123, in which the solder joining layer includes a first structure 1 containing $(Cu, Ni)_6(Sn, Sb)_5$ and a second structure 2 containing $(Ni, Cu)_3(Sn, Sb)_X$ (in the formula, X is 1, 2, or 4) at an interface with the Cu or Cu-alloy member 123, and an electronic device and a semiconductor device including the solder joining.

20 Claims, 10 Drawing Sheets

(51) Int. Cl.
H01L 23/00 (2006.01)
B23K 35/26 (2006.01)
C22C 13/02 (2006.01)
H01L 21/52 (2006.01)
B23K 35/30 (2006.01)
B23K 35/02 (2006.01)
H01L 23/373 (2006.01)
H05K 3/34 (2006.01)
B23K 103/12 (2006.01)
B23K 101/40 (2006.01)

(52) U.S. Cl.
CPC .......... *B23K 35/262* (2013.01); *B23K 35/302* (2013.01); *C22C 13/02* (2013.01); *H01L 21/52* (2013.01); *H01L 23/3735* (2013.01); *H01L 24/73* (2013.01); B23K 2101/40 (2018.08); B23K 2103/12 (2018.08); H01L 2224/2912 (2013.01); H01L 2224/29101 (2013.01); H01L 2224/29111 (2013.01); H01L 2224/29117 (2013.01); H01L 2224/29139 (2013.01); H01L 2224/29147 (2013.01); H01L 2224/29155 (2013.01); H01L 2224/29164 (2013.01); H01L 2224/29169 (2013.01); H01L 2224/29173 (2013.01); H01L 2224/32225 (2013.01); H01L 2224/48091 (2013.01); H01L 2224/48472 (2013.01); H01L 2224/73265 (2013.01); H01L 2924/014 (2013.01); H01L 2924/01015 (2013.01); H01L 2924/01032 (2013.01); H01L 2924/10253 (2013.01); H01L 2924/10272 (2013.01); H01L 2924/13055 (2013.01); H01L 2924/181 (2013.01); H01L 2924/19107 (2013.01); H01L 2924/35121 (2013.01); H05K 3/3463 (2013.01); H05K 2201/10166 (2013.01)

(58) Field of Classification Search
CPC ... B23K 35/025; B23K 35/0233; B23K 35/24
See application file for complete search history.

(56) References Cited

U.S. PATENT DOCUMENTS 10,213,879 B2 * 2/2019 Yoshikawa .......... B23K 35/262
2016/0368104 A1 12/2016 Irisawa et al.
2017/0014955 A1 1/2017 Ueshima et al.

FOREIGN PATENT DOCUMENTS

| JP | 2005-116702 | 4/2005 |
| WO | WO 2015/125855 A1 | 8/2015 |
| WO | WO 2015/152387 A1 | 10/2015 |
| WO | WO 2017/047289 A1 | 3/2017 |

* cited by examiner (Cu,Ni)$_3$(Sn,Sb)
(Cu,Ni)$_6$(Sn,Sb)$_5$ (Ni,Cu)$_3$Sn$_4$
(Ni,Cu)$_6$Sn$_5$
(Ni,Cu)$_3$(Sn,Sb)$_4$
(Cu,Ni)$_6$(Sn,Sb)$_5$ (Cu,Ni)$_6$(Sn,Sb)$_5$ (Ni,Cu)$_3$Sn$_4$
(Ni,Cu)$_6$Sn$_5$
(Ni,Cu)$_3$(Sn,Sb)$_4$
(Cu,Ni)$_6$(Sn,Sb)$_5$

SOLDER JOINING

CROSS-REFERENCE TO RELATED APPLICATIONS

This application is a continuation application, under 35 U.S.C. § 111(a), of international application No. PCT/JP2017/017659, filed May 10, 2017, which is based on and claims foreign priority to Japanese patent application No. 2016-119970, filed Jun. 16, 2016, the entire disclosures of which are herein incorporated by reference as a part of this application.

TECHNICAL FIELD

The present invention relates to an electronic device. The present invention relates in particular to a solder joining capable of preventing a solder joining layer at an interface between different materials from peeling off, and relates to an electronic device including the solder joining.

BACKGROUND ART

In recent years, a Pb-free solder which does not contain a lead component is beginning to be used as a substitute for a Sn—Pb-based solder in consideration of environmental problems. As a solder material to be applied to a semiconductor device such as an IGBT module (power module), a Sn—Ag-based Pb-free solder, which has relatively good balance, particularly in terms of bondability (solder wettability), mechanical property, thermal resistance, and the like and which is actually employed in products, is widely used among presently known lead-free solders of various compositions.

In a semiconductor device having a layered connection structure in which an insulating substrate is mounted on a heat sink and a semiconductor element is further solder-joined thereon, there is known a solder joining structure in which a lower joining employs a Sn—Sb-based solder as a high-temperature lead-free solder, and an upper joining employs a lead-free solder with a composition of a Sn—Ag-based solder, having a melting point lower than the Sn—Sb-based solder, added with an element such as Cu (for example, see Patent Document 1).

In addition, there is known a structure intended to prevent concentration of heat generation density by solder-joining a lead frame, which is a wiring member and also serves as a heat spreader, to a top electrode of a semiconductor element (IGBT) solder-mounted on an insulating substrate and by guiding heat generated from the semiconductor element to the lead frame (for example, see Patent Document 2).

As a solder material effective in preventing cracks at high temperatures attributed to heat generation of a semiconductor element, there is also known a tape- or wire-shaped solder material with a Sn—Sb—Ag composition which has an excellent ductility at a temperature of 170° C. and which has an excellent cold workability (for example, see Patent Document 3).

REFERENCE DOCUMENT LIST

Patent Documents

Patent Document 1: JP 2001-35978 A
Patent Document 2: JP 2005-116702 A
Patent Document 3: JP 7-284983 A

SUMMARY

MOS-type and IGBT-type elements, called power semiconductors, experience self-heating during operation and reach high temperatures. Elements which are repeatedly heated and cooled are joined by solder, and a soldered portion thereof experiences repetitive distortion caused by repetitive heating of the elements, resulting in deterioration. Here, a solder-joined interface may peel off due to cracks.

There is an increasing demand for power semiconductors designed for high current in recent years, and there is a tendency for greater amounts of self-heating of elements. In addition, there is an increasing demand for e.g. vehicle-mounted power semiconductors, which are required to operate in use in environmental temperatures exceeding 175° C. Under such circumstances, there arises a problem in that a joining at an interface between different materials peeling off due to a difference in coefficient of thermal expansion.

The present inventors have intensively researched to understand that such a problem can be solved by using, when joining a Cu member, a solder material prepared by adding a specific amount of Ni to Sn—Sb—Ag, forming a particular structure at a joining interface. To be more specific, according to an aspect, the present invention relates to a solder joining including: a solder joining layer having a melted solder material, comprising more than 5.0% by mass and 10.0% by mass or less of Sb, 2.0 to 4.0% by mass of Ag, more than 0 and 1.0% by mass or less of Ni, and a balance made up of Sn and inevitable impurities; and joining members, at least one of which is a Cu or Cu-alloy member, in which the solder joining layer includes a first structure containing $(Cu, Ni)_6(Sn, Sb)_5$ and a second structure containing $(Ni, Cu)_3(Sn, Sb)_X$ (in the formula, X is 1, 2, or 4) at an interface with the Cu or Cu-alloy member.

In the joining, the solder material preferably further comprises 0.001 to 0.1% by mass of Ge.

In the joining, a solder material having any of the compositions preferably further comprises more than 0 and 1.2% by mass or less of Cu.

In the joining, a solder material having any of the compositions preferably further comprises 0.001 to 0.1% by mass of P.

In the joining, the Ni of the solder material having any of the compositions is preferably partially substituted with one or more elements selected from Pt, Pd, and Rh.

In the joining, a content of the Ni of a solder material having any of the compositions or a total content of Ni and one or more elements selected from Pt, Pd, and Rh is preferably 0.1 to 0.4% by mass.

In the joining, the first structure is preferably a particle-shaped compound, and the second structure is preferably a needle-shaped compound or a pillar-shaped compound.

In the joining, the first structure is preferably distributed at an interface of the solder joining layer with the Cu or Cu-alloy member, and the second structure is preferably in contact with the first structure and is preferably distributed on an inner side of the solder joining layer.

According to other embodiments, the present invention is an electronic device or a semiconductor device including any of the solder joinings described above.

The present invention makes it possible to achieve a high-temperature thermal resistant joining which prevents local concentration of shear strain at a joining interface between different materials attributed to a difference in linear expansion coefficient and peeling caused by shear strain. An electronic device including a joining according to the present invention has a high joining strength and is suitable for use in the case of including a highly self-heating element and in the case of high environmental temperature. Moreover, the joining makes it possible to reduce the size and cost of a device.

DESCRIPTION OF EMBODIMENTS

Figure 1:
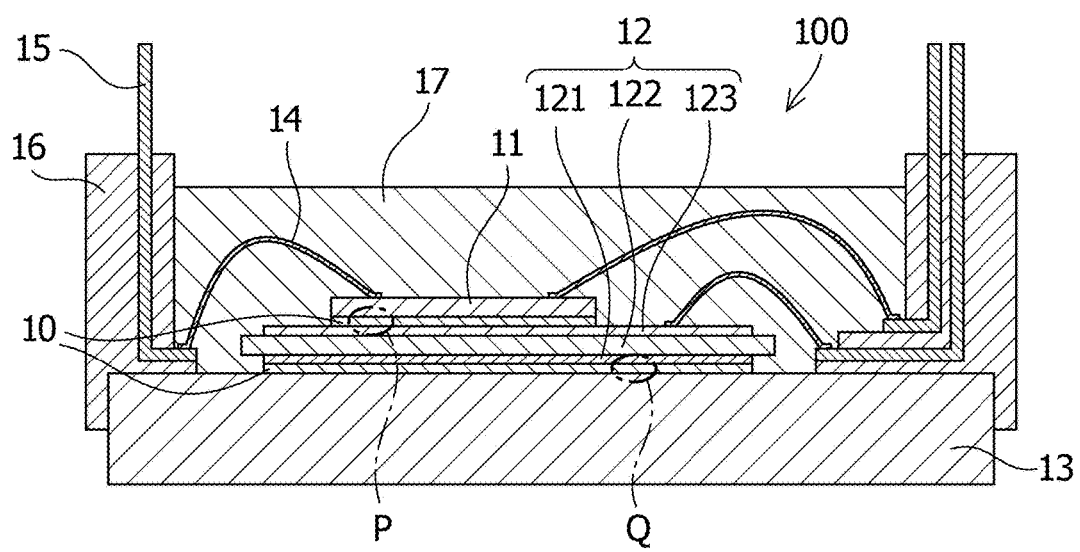
FIG. 1 is a conceptual diagram illustrating a semiconductor device being an example of an electronic device to which a joining according to the present invention is applied.

Hereinafter, embodiments of the present invention are described with reference to the drawings. Note that the present invention is not limited by these embodiments described below.

According to an embodiment, the present invention relates to a joining which includes: a solder joining layer having a melted solder material, containing Sb at more than 5.00% by mass and 10.0% by mass or less, Ag at 2.0 to 4.0% by mass, Ni at more than 0 and 1.0% a by mass or less, and a balance made up of Sn and inevitable impurities; and joining members at least one of which is a Cu or Cu-alloy member, in which the solder joining layer includes a first structure containing $(Cu, Ni)_6(Sn, Sb)_5$ and a second structure containing $(Ni, Cu)_3(Sn, Sb)_X$ (in the formula, X represents 1, 2, or 4) at an interface with the Cu or Cu-alloy member. Throughout the entire specification, if A, B, C, and D each represent a metal element, and a and b each represent an integer, an intermetallic compound identified by $(A, B)_a(C, D)_b$ represents a form mixed with more than one intermetallic compound including an $A_aC_b$ compound in which some of A may be substituted with B and some of C may be substituted with D. In addition, in this case, the percentage of the preceding element A in the parentheses is greater than the percentage of the following B. Similarly, the percentage of C is greater than the percentage of D. In addition, in the present specification, the solder joining layer refers to one in a state in which the solder material is melted and joined to the joining members. In addition, the solder joining refers to a concept including the solder joining layer and the joining members. The joining members refer to members which come into contact with the surfaces of the solder joining layer and which are joined by the solder joining layer.

In the present embodiments, the joining includes a joining member being a Cu or Cu-alloy member on at least one of the surfaces of the solder joining layer. The Cu or Cu-alloy member may be a pure Cu member or may be a Cu-alloy member which contains Cu as a main component and contains one or more metal elements selected from, for example, Sn, Zn, Ni, Au, Al, Mo, Zn, C, and Si. Hereinafter, in the present specification, the Cu or Cu-alloy member may be referred to as the Cu member in an omitted manner. If one of the joining members is a Cu member, the other of the joining members may be a Cu member or other member. The other of the joining members may be a general electronic device member at least including a metal member on the joining surface thereof, and is typically a metal member serving as an electrode. Examples include an electrode member made of Cu, Ag, Au, Ni, or Fe, or an alloy of these.

In the joining of the present embodiments, the solder material constituting the solder joining layer includes any of the following first embodiment to the fifth embodiment having a basic composition of Sn—Sb—Ag—Ni.

First Embodiment: Sn—Sb—Ag—Ni Quaternary System

The solder composition according to the first embodiment includes Sb at more than 5.0% by mass and 10.0% by mass or less, Ag at 2.0 to 4.0% by mass, and Ni at more than 0 and 1.0% by mass or less, and the balance is made up of Sn and inevitable impurities. The amount of Ni added is more preferably such that Ni is 0.01 to 0.5% by mass, and further preferably 0.1 to 0.4% by mass. This is because if Ni in an amount within these ranges is added to the Sn—Sb—Ag solder, it is possible to, when joined to the Cu member, form a first structure and a second structure made of an intermetallic compound on the solder joining layer and to increase the shear strength of the joining interface between different materials. Further preferably, Sb is included at 6.0% by mass to 8.0% by mass, Ag is included at 3.0 to 4.0% by mass, and Ni is included within any of the above ranges, and the balance is made up of Sn and inevitable impurities.

As a modified embodiment of this first embodiment, the composition may have Ni partially substituted with one or more elements made up of Pt, Pd, and Rh. This is because Ni and these precious metal elements can similarly be a solidification nucleus in the formation of the second structure made of the intermetallic compound and contribute to the production of the intermetallic compound. If the total content of Ni is set to 100%, for example, about 60% by mass or less may be substituted with these elements. In this case, the total content of Ni and one or more elements selected from Pt, Pd, and Rh is preferably more than 0 and 1.0% by mass or less, more preferably 0.01 to 0.5% by mass, and further preferably 0.1 to 0.4% by mass. Note that in any of the second to fifth embodiments to be described later, the composition may have Ni partially substituted with one or more elements selected from Pt, Pd, and Rh. The preferable content in that case can be set in the same manner as the above.

Second Embodiment: Sn—Sb—Ag—Ni—Ge Quinary System

The solder composition according to the second embodiment includes Sb at more than 5.0% by mass and 10.0% by mass or less, Ag at 2.0 to 4.0% by mass, Ni at more than 0 and 1.0% by mass or less, and Ge at 0.001% by mass to 0.1% by mass, and the balance is made up of Sn and inevitable impurities. The advantage of further adding Ge to the composition of the first embodiment is that it is possible to contribute to the improvement of solder wettability by suppressing the oxidization of Sn and to affect the thermal diffusion path of the alloy. The amount of Ge added is more preferably 0.003 to 0.05% by mass. If Ge in an amount within this range is added, excessive production of GeO is suppressed and an appropriate amount of GeO is produced. Thus, it is possible to suppress an oxide of Sn which is difficult to reduce or remove. Furthermore, addition of Ge provides an effect of suppressing voids. In addition, regarding the amount of Ni added in this case, Ni is more preferably 0.01 to 0.5% by mass and further preferably 0.1 to 0.4% by mass. The advantage of adding Ni within the above ranges is that it is possible to improve the solder strength at the interface while keeping the effect of improving the wettability of Ge. In addition, Ni is a high melting point material and thus has an advantage of being able to increase strength at high temperatures. Further preferably, Sb is included at 6.0% by mass to 8.0% by mass, Ag is included at 3.0 to 4.0% by mass, Ni and Ge each are included within any of the above ranges, and the balance is made up of Sn and inevitable impurities. The above composition ranges make it possible to increase the thermal conductivity of the alloy with temperature increase while suppressing the oxidation of Sn.

Third Embodiment: Sn—Sb—Ag—Ni—Cu Quinary System

The solder composition according to the third embodiment includes Sb at more than 5.0% by mass and 10.0% by mass or less, Ag at 2.0 to 4.0% by mass, Ni at more than 0 and 1.0% by mass or less, and Cu at more than 0 and 1.2% by mass or less, and the balance is made up of Sn and inevitable impurities. The advantage of further adding Cu to the composition of the first embodiment is that it is possible to affect the thermal diffusion path of the alloy to increase the thermal conductivity of the alloy, and at the same time to improve wettability, achieving a low void rate when forming a joining layer. The above addition ranges are advantageous because when joining the Cu member, the melting point of the solder joining layer does not rise, the melting point is insensitive to the composition of the solder joining layer, the composition margin is wide, and component variation is small. In other words, copper contained in the solder material reduces the rate of dissolution of Cu from the Cu member to the solder joining layer, resulting in the decrease in the change of concentration of Cu. This makes it possible to suppress at a low level the increase in the melting point of the solder joining layer attributed to the dissolution of Cu. In addition, it is advantageous that it is possible to prevent dissolution of Cu from the Cu member to the solder material. Also in the composition of the third embodiment, the amount of Ni added is more preferably 0.01 to 0.5% by mass and further preferably 0.1 to 0.4% by mass. Further preferably, Sb is included at 6.0% by mass to 8.0% by mass, Ag is included at 3.0 to 4.0% by mass, Cu is included at 0.1 to 0.9% by mass, Ni is included within any of the above ranges, and the balance is made up of Sn and inevitable impurities. The above composition ranges make it possible to, in addition to the above, further obtain an advantage of good wettability in particular.

Fourth Embodiment: Sn—Sb—Ag—Ni—Ge—Cu Senary System

The solder composition according to the fourth embodiment includes Sb at more than 5.0% by mass and 10.0% by mass or less, Ag at 2.0 to 4.0% by mass, Ni at more than 0 and 1.0% by mass or less, Cu at more than 0 and 1.2% by mass or less, and Ge at 0.001% by mass to 0.1% by mass, and the balance is made up of Sn and inevitable impurities. The advantage of further adding Ge to the composition of the third embodiment is that it is possible to suppress an oxide of Sn which is difficult to be reduced or removed and to obtain an effect of suppressing voids. The amount of Ge added is more preferably 0.003 to 0.05% by mass. It is possible to add Ge in this amount to all compositions described in the third embodiment.

Fifth Embodiment: First to Fourth Embodiments Added with P

As a further modified embodiment, it is possible to add P to the solder materials according to the first to fourth embodiments and for example to include P at 0.001% by mass to 0.1% by mass. This is because P has an effect of suppressing oxidation of the solder material and can contribute to the improvement of wettability. P more easily oxidizes than Sn does and thus can prevent oxidation of Sn within this addition range and provide wettability of the solder material.

In any of the above embodiments and modified embodiments thereof, it is possible to prepare the solder material according to the above embodiments by dissolving, in an electric furnace, raw materials selected from Sn, Sb, Ag, Ni, and other addition elements, or a master alloy containing these raw materials in accordance with an ordinary method. It is preferable to use the raw materials having purity of 99.99% by mass.

In addition, in the formation of the solder joining layer, it is possible to process the above solder material as a plate-shaped preform material or as a cream solder made by mixing powdered material with flux. In the case of forming a cream solder by processing the material to a powder and then combining it with flux, the particle diameter of the solder powder is preferably one having a particle diameter distribution within a range of 10 to 100 μm and further preferably within a range of 20 to 50 μm. The average particle diameter can be, for example, 25 to 50 μm when performing measurement by use of a commonly used laser diffraction/scattering type particle size distribution measurement apparatus. Any flux can be used as the flux. It is possible to preferably use a rosin-based flux in particular.

The thickness, the shape, and the like of the solder material used to form the solder joining layer are not particularly limited because one skilled in the art can appropriately set in accordance with the purpose and use. The solder material of the above embodiments has a good wettability compared to the related art, and can be thin because voids are unlikely to be produced. Thinness reduces thermal resistance, which is preferable in semiconductor devices. On the other hand, if a chip of the semiconductor element is warped, it is necessary to increase the thickness in a manner corresponding to the warpage. Voids tend to be produced in that situation, but good wettability can prevent voids attributed to porosity. In addition, good service life is achieved because a large thickness provides an effect of releasing stress. Thus, both thin and large thicknesses can be achieved, which provides a high degree of freedom of design. As an example, the thickness of the solder joining layer can be about 200 to 300 μm, but is not limited to this range.

Regarding the formation of the joining, it is preferable to melt the solder material and then to form the solder joining layer by setting the heating peak temperature to approximately the liquidus temperature (melting point) of the solder material +30° C. while keeping the solder material and the Cu member in contact with each other. Regarding the heating time in this case, retention of 60 seconds or more is preferable. Although it depends on the form of the solder material, it is possible to perform joining by use of hydrogen or an active atmosphere of an organic acid such as formic acid.

The joining according to the present embodiments constitutes a part of the electronic device. Examples of the electronic device include, but are not limited to, electronic or power devices such as an inverter, mega solar, a fuel cell, an elevator, a cooling device, a vehicle-mounted semiconductor device, and the like. Typically, the electronic device is a semiconductor device. The joining in a semiconductor device includes, but is not limited to, a die bond joining, a joining between a terminal and a terminal, a joining between a terminal and another member, or alternatively other desired joinings. Hereinafter, the present invention is described in further detail with reference to the drawings by describing a semiconductor device as an example of the electronic device provided with the joining according to the present embodiments.

FIG. 1 illustrates a conceptual cross-sectional view of a power module being an example of the semiconductor device. A power module 100 mainly has a laminate structure in which a semiconductor element 11 and a laminate substrate 12 are joined on the heat sink plate 13 using a solder joining layer 10. A case 16 storing an external terminal 15 is bonded to the heat sink plate 13, and an electrode of the semiconductor element 11 and the laminate substrate 12 is connected to the external terminal 15 by an aluminum wire 14. A resin sealant 17 fills the inside of the module. The semiconductor element 11 may be, but is not limited to, a Si semiconductor element or a SiC semiconductor element. For example, in the case of these elements mounted in the IGBT module, the back electrode joined to the laminate substrate 12 ordinarily includes Au or Ag. Regarding the laminate substrate 12, the front and the back of a ceramic insulating layer 122 made of alumina, SiN, or the like are provided with conductive metal plates 121 and 123 made of copper or aluminum. Metals excellent in thermal conductivity such as copper and aluminum are used for the heat sink plate 13. In addition, in order to prevent corrosion, there is a case in which the conductive metal plates 121 and 123 or heat sink plate 13 is covered with Ni and Ni-alloy.

In the illustrated power module 100, the Cu members which can be joined to the solder joining layer are conductive plates 121 and 123 on both upper and lower surfaces constituting the laminate substrate 12 and a heat sink 13. In addition, although not illustrated, there may be a lead frame or a pin which electrically connects a semiconductor element and a printed circuit board together in a power module provided with other structures.

In the power module 100 illustrated in FIG. 1, in particular, the joining P among the semiconductor element 11, the solder joining layer 10, and the conductive plate 123 made of Cu and the joining Q among the conductive plate 121 made of Cu, the solder joining layer 10, and the Cu heat sink 13 correspond to the joining according to the present embodiments.

Figure 2:
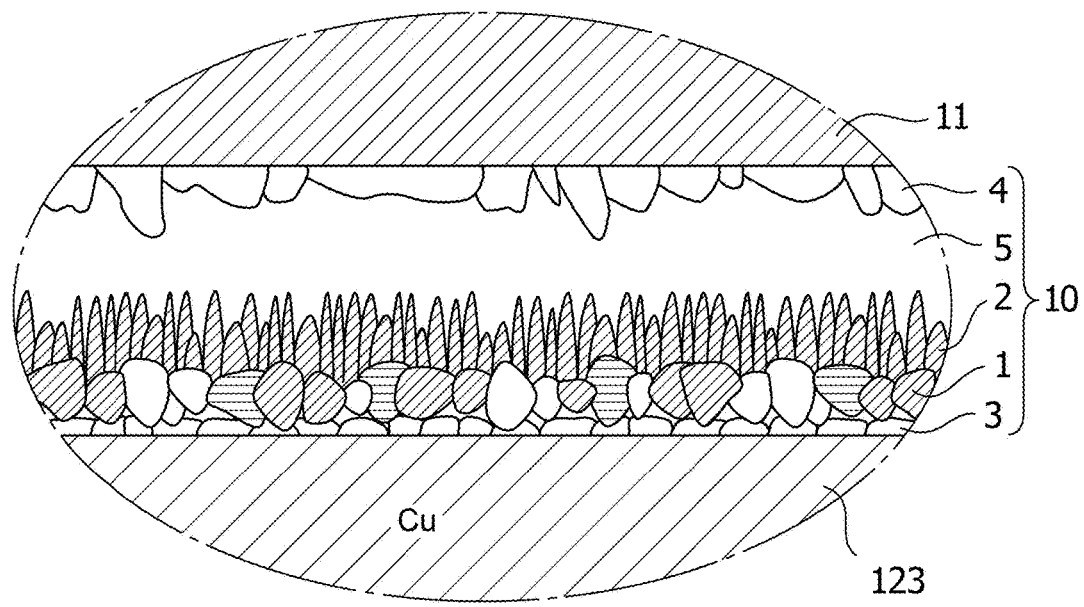
FIG. 2 is an enlarged conceptual diagram of a joining P of the semiconductor device illustrated in FIG. 1 and illustrates a joining between a solder joining layer and a Cu member.

FIG. 2 is an enlarged conceptual diagram of the joining P in FIG. 1. In FIG. 2, the Cu conductive plate 123, the solder joining layer 10, and the semiconductor element 11 are stacked in this order. The solder joining layer 10 is the melted solder material according to any of the above-described first embodiment to the fifth embodiment. The joining surface of the semiconductor element 11 with the solder joining layer 10 ordinarily includes Au or Ag. Additionally, at the interface of the solder joining layer 10 with the Cu conductive plate 123, a $Cu_3(Sn, Sb)$ structure 3 being an intermetallic compound, a first structure 1, and a second structure 2 are formed in the order from the interface. On the other hand, at the interface of the joining layer 10 with the semiconductor element 11, an intermetallic compound 4 is formed. If the electrode of the semiconductor element 11 is Ni, the intermetallic compound 4 mainly contains a NiSn compound or a NiSb compound. A solder metal structure 5 composed of component elements of the solder material is present in between.

A portion of the solder joining layer 10 nearest to the interface with the Cu conductive plate 123 being a joining member has a Cu-rich composition because of the Cu originating from the Cu conductive plate 123. In addition, the $Cu_3(Sn, Sb)$ structure 3 of the intermetallic compound being the main structure is a relatively flat and relatively thin layer formed by a sequence of particles. The thickness of the layer of the intermetallic compound may be, but is not limited to, about 2 μm to 50 μm, for example, although it varies depending on the joining conditions and composition.

The first structure 1 is mainly formed of $(Cu, Ni)_6(Sn, Sb)_5$. The first structure 1 is in contact with the $Cu_3(Sn, Sb)$ structure 3 and is stacked on the inner side of the solder joining layer 10 compared to the $Cu_3(Sn, Sb)$ structure 3. The first structure 1 is a sequence of particle-shaped compounds. There is a case in which the particle-shaped portion has $(Ni, Cu)_3(Sn, Sb)_4$ being a main component of the second structure 2 mixed therein or $(Ni, Cu)(Sn, Sb)$ present therein. The particle-shaped portion is actually composed of compounds of various compositions. In the illustrated embodiments, although no limitation is imposed, the layer thickness of the first structure 1 is thicker than the layer thickness of the $Cu_3(Sn, Sb)$ structure 3 and approximately the same as the layer thickness of the second structure 2. The thickness relationship among the structures may be reversed.

The second structure 2 is mainly formed of $(Ni, Cu)_3(Sn, Sb)_4$, $(Ni, Cu)_3(Sn, Sb)_2$, and $(Ni, Cu)_3(Sn, Sb)$. In addition to these, the second structure 2 includes $(Ni, Cu)_3Sn_4$, $(Ni, Cu)_6Sn_5$, and $(Cu, Ni)_6(Sn, Sb)_5$. Regarding the shape of the structure, Ni-rich $(Ni, Cu)_3(Sn, Sb)_4$ tends to be the shape of a needle or a pillar. The others may include the shape of a developing particle, the shape of a block, the shape of a plate, the shape of a polygon, and the like. This second structure 2 is in contact with the first structure 1 and is stacked on the inner side of the solder joining layer 10 compared to the first structure 1. Additionally, the second structure 2 is present as a needle-shaped compound or a pillar-shaped compound formed from the interface of the solder joining layer 10 with the Cu member 123 toward the inner side of the solder joining layer 10. The needle-shaped compound or the pillar-shaped compound is formed at an angle of about 45° to 135° relative to the surface of the Cu member 123. Note that there is a case in which all needle-shaped compounds or pillar-shaped compounds have grown not at the same angle but at different angles. Due to the needle-shaped compound or pillar-shaped compound formed within this range, the interface between the Cu member 123 and the solder joining layer 10 is complicated and shear stress-resistant, making it possible to form an interface structure resistant to an external force produced by, for example, thermal stress.

These structures can be identified using an EPMA (Electron Probe Micro Analyzer), a TEM (Transmission electron microscopy), an EDX (Energy Dispersive X-ray spectroscopy), an SEM (Scanning electron microscopy), and the like.

In the joining of the present invention, a solder material having a particular composition and a Cu member are combined to perform joining, and then a solder joining layer being the melted solder material is formed. Thus, it is possible to form a laminate structure of the above-described characteristic structure and to improve the shear strength of the joining. Note that FIG. 2 is a conceptual diagram and that the thickness of the solder joining layer 10, the sizes of the first structure 1, the second structure 2, and the intermetallic compound 4, and relative dimensions are not limited to those in the figure.

On the other hand, in the joining Q of FIG. 1, the joining members on both sides of the solder joining layer 10 are Cu members. For this reason, at each of the interfaces of the solder joining layer 10 with the Cu conductive plate 121 and with the heat sink 13, a $Cu_3(Sn, Sb)$ structure, the first structure, and the second structure are formed in the order from the interface. In such a configuration, structures such as needle-shaped compounds are formed on both surfaces of the solder joining layer 10. Thus, it is possible to form a joining that is resistant particularly to shear stress.

Figures 3A, 3B:
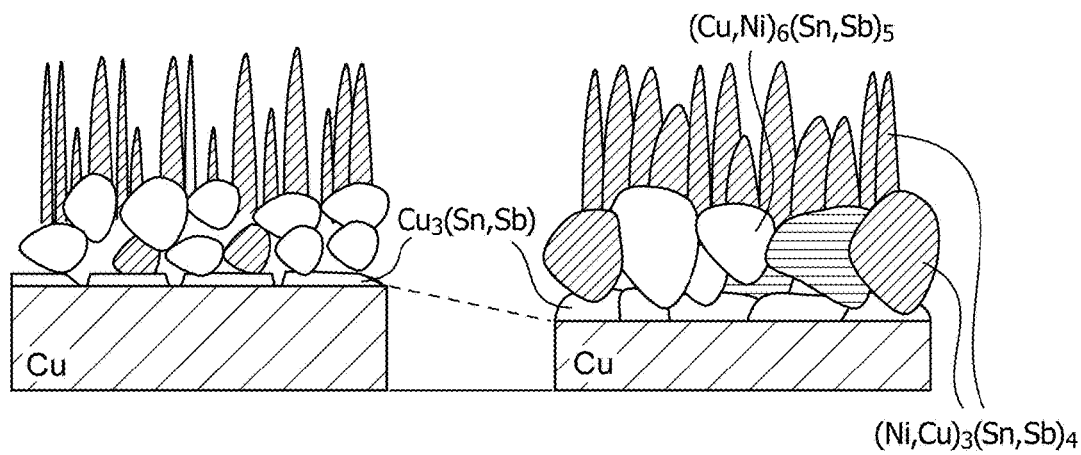
FIGS. 3A and 3B are diagrams schematically illustrating formation of an intermetallic compound structure of the solder joining layer according to the present embodiments.

Next, the relationship between the shape of the above intermetallic compound structure and the shear strength of the solder joining layer is discussed using a schematic diagram. FIGS. 3A and 3B are diagrams schematically illustrating the interface between the solder joining layer and the Cu member, according to the present invention. (A) is an early stage of formation of the intermetallic compound, and (B) illustrates the interface structure formed after heat treatment. The particle-shaped $(Cu, Ni)_6(Sn, Sb)_5$ compound crystallized on $Cu/Cu_3(Sn, Sb)$ at a portion of dissolving and diffusing from the Cu member (electrode) into the solder. Since Ni is contained in the solder material, $(Ni, Cu)_3(Sn, Sb)_4$, which is formed with Ni contained in the solder as the solidification nucleus, crystallizes in the shape of a needle on the particle-shaped compound. At the interface, the needle-shaped compound of $(Ni, Cu)_3(Sn, Sb)_4$ crystallizes in the shape of a spike, making the interface complicated. As a result, the force applying on the interface is distributed, providing an effect of preventing peeling near the interface between different materials caused by shear stress generated due to a difference in linear expansion coefficient.

Figures 4A, 4B:
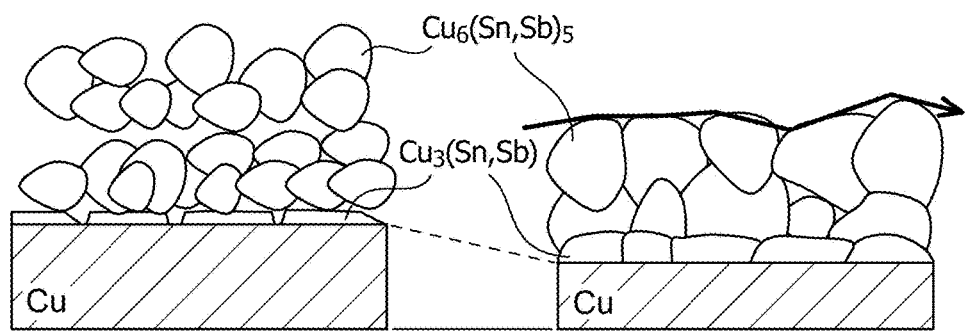
FIGS. 4A and 4B are diagrams schematically illustrating formation of an intermetallic compound structure of the solder joining layer according to the related art.

FIGS. 4A and 4B are diagrams schematically illustrating the interface between the solder joining layer and the Cu member in the case of using a Sn—Sb-based solder material according to the related art. (A) is an early stage of formation of the intermetallic compound, and (B) illustrates the interface structure formed after heat treatment. Sb is a peritestic material and experiences peritestic crystallization such that Sn wraps Sb with Sb as a nucleus. Thus, a relatively flat laminate structure is formed at the interface of the solder joining layer with the Cu member. For this reason, the interface between different materials is likely to strain in a concentrating manner due to the shear strain generated because of the difference in linear expansion coefficient between the solder material and the Cu member. Hence, the crack as indicated by the arrow in the figure is likely to be produced.

Figures 5A, 5B:
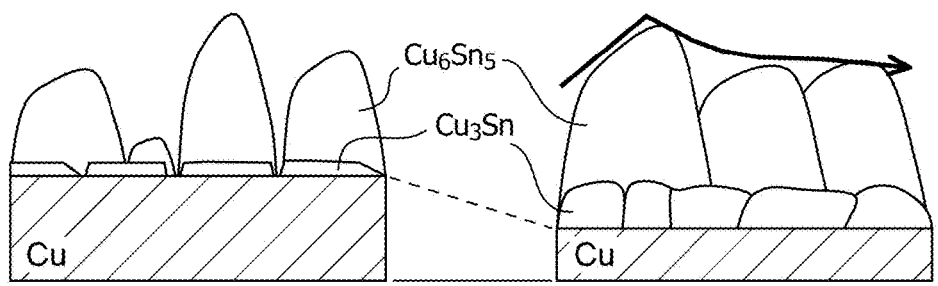
FIGS. 5A and 5B are diagrams schematically illustrating formation of an intermetallic compound structure of the solder joining layer according to the related art.

FIGS. 5A and 5B are diagrams schematically illustrating the interface between the solder joining layer and the Cu member in the case of using a Sn—Ag—Cu-based solder material according to the related art. (A) is an early stage of formation of the intermetallic compound, and (B) illustrates the interface structure formed after heat treatment. In this case, when Cu is dissolved into the solder, the intermetallic compound formed at the interface is $Cu_6Sn_5$, and a flat laminate structure is also formed at the interface with the Cu member. Hence, the crack as indicated by the arrow in the figure is likely to be produced.

Figure 6C:
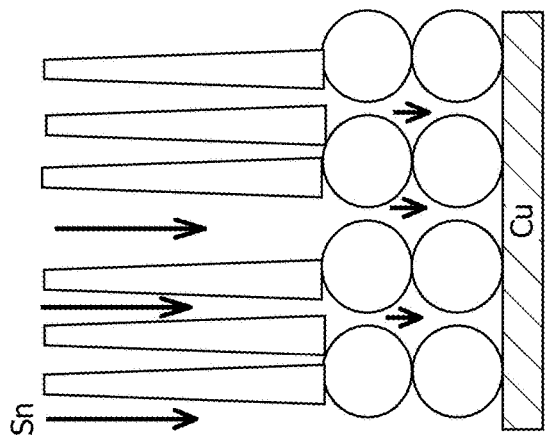
FIGS. 6A, 6B, 6C, 6D, and 6E are diagrams schematically explaining a formation mechanism of the intermetallic compound structure of the solder joining layer according to the present embodiments.
Figure 6B:
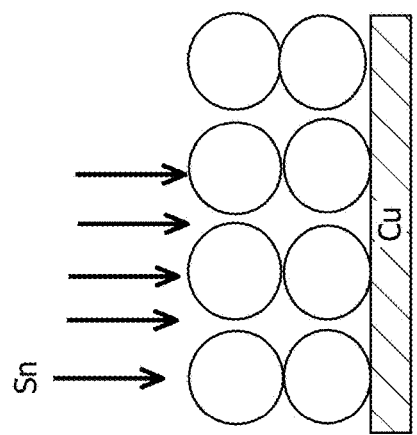
Figure 6E:
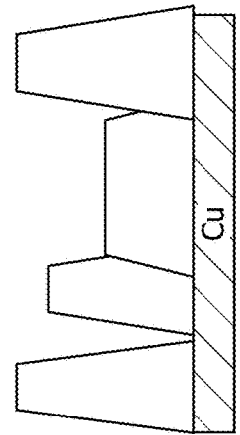
Figure 6A:
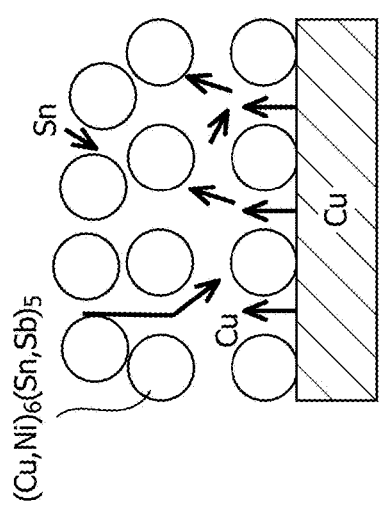
Figure 6D:
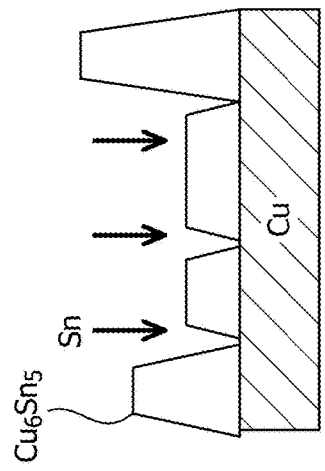

FIGS. 6A, 6B and 6C each are a diagram schematically explaining the formation of the structure over time in the case of joining by use of the solder material having the composition according to the present invention. FIG. 6A illustrates an early stage of heating and melting the solder material in contact with the Cu member. Here, Cu dissolves into the solder and a particle-shaped compound grows at the interface between the solder joining layer and the Cu member in an accumulated manner. Next, referring to FIG. 6B, the dissolved Cu makes a structure in which $Cu_6(Sn, Sb)_5$ reaction phase particles are accumulated at the interface of the solder joining layer with the Cu member. This accumulation layer grows due to grain boundary diffusion of the particle-shaped compound. Then, the supply of Sn from the liquid solder material into the accumulation layer decreases. When the supply of Sn decreases, the concentrations of Cu and Ni increase in the accumulation layer, which forms a high melting point liquid. Thus, the supply of liquid Sn into the solder decreases. Referring to FIG. 6C being the next stage, liquid Sn is supplied at the contact portion between the accumulation layer and the liquid solder. The particle-shaped compound being the solidification nucleus grows. In the interdiffusion between Sn and the set of Cu and Ni, during the growth of the compound containing Sb, the concentration of excess Sb increases in the accumulation layer because it is difficult to make the compound with Cu and Sb. As a result, excess Sb is present at the interface with the solder. The compound grows due to interdiffusion between the Sb and an element which easily diffuses. Thus, a NiSb-based compound is produced, promoting the production of a pillar-shaped or needle-shaped compound. On the other hand, FIGS. 6D and 6E are each a diagram explaining the formation of structure in the case of joining by use of a solder material not containing Ni. In FIG. 6D, grain boundary diffusion causes phase growth and in FIG. 6E, liquid Sn is supplied to compound particles which are likely to experience selective growth, promoting growth in a large size. In this case, however, a pillar-shaped or needle-shaped compound is not produced.

EXAMPLES

The joining of the examples according to the present invention and the joining of the comparative examples were produced using the solder materials having the compositions indicated in Table 1 below. In the table, "-" means that the corresponding element is not contained except for inevitable impurities.

TABLE 1

| Sample Number | | Component mass % | | | | |
|---|---|---|---|---|---|---|
| | | Sn | Sb | Ag | Ni | other(s) |
| 1 | Sn—5Sb | Bal. | 5 | — | — | — |
| 2 | Sn—7Sb—2Ag | Bal. | 7 | 2 | — | — |
| 3 | Sn—6Sb—4Ag | Bal. | 6 | 4 | — | — |
| 4 | Sn—9Sb—3Ag | Bal. | 9 | 3 | — | — |
| 5 | Sn—6Sb—4Ag—2.0Ni | Bal. | 6 | 4 | 2.0 | — |
| 6 | Sn—6Sb—4Ag—1.0Ni | Bal. | 6 | 4 | 1.0 | — |
| 7 | Sn—6Sb—4Ag—0.4Ni | Bal. | 6 | 4 | 0.4 | — |
| 8 | Sn—6Sb—4Ag—0.01Ni | Bal. | 6 | 4 | 0.01 | — |
| 9 | Sn—6Sb—4Ag—0.01Ni—0.001Ge | Bal. | 6 | 4 | 0.01 | Ge 0.001 |
| 10 | Sn—6Sb—4Ag—0.01Ni—0.05Ge | Bal. | 6 | 4 | 0.01 | Ge 0.05 |
| 11 | Sn—6Sb—4Ag—0.5Ni—0.001Ge | Bal. | 6 | 4 | 0.5 | Ge 0.001 |
| 12 | Sn—6Sb—4Ag—0.5Ni-0.05 Ge | Bal. | 6 | 4 | 0.5 | Ge 0.05 |
| 13 | Sn—6Sb—4Ag—0.01Ni—0.1Cu | Bal. | 6 | 4 | 0.01 | Cu 0.1 |
| 14 | Sn—6Sb—4Ag—0.01Ni—0.9Cu | Bal. | 6 | 4 | 0.01 | Cu 0.9 |
| 15 | Sn—6Sb—4Ag—0.5Ni—0.1Cu | Bal. | 6 | 4 | 0.5 | Cu 0.1 |
| 16 | Sn—6Sb—4Ag—0.5Ni—0.9Cu | Bal. | 6 | 4 | 0.5 | Cu 0.9 |
| 17 | Sn—6Sb—4Ag—0.01Ni—0.1Cu—0.05Ge | Bal. | 6 | 4 | 0.01 | Cu 0.10 Ge 0.05 |

(1) Production and Observation of Joining

The solder material of sample number 7 was used to produce the joining according to Example 1. To be more specific, a conductive plate made of copper being a DCB (Direct Copper Bonding) substrate and a Ni member resembling an element electrode were joined by using a solder material having a composition of Sn-6Sb-4Ag-0.4Ni, which contained 6% by mass of Sb, 4% by mass of Ag, and 0.4% by mass of Ni with the balance made up of Sn and inevitable impurities. Note that the DCB substrate is a laminate substrate formed by joining conductive metal plates made of e.g. copper directly to both sides of an insulating layer such as an alumina-based ceramic by a Direct Copper Bond method. The joining conditions were such that the joining time was 4 minutes and a temperature of 300° C. or more was maintained for 1 minute or more. In this experiment, the joining was performed in a hydrogen atmosphere and no flux was used. The thickness of the joining solder layer was 250 μm, and the solder plate was supplied and joined in the same dimensions as the Ni member resembling the element electrode.

Figure 7:
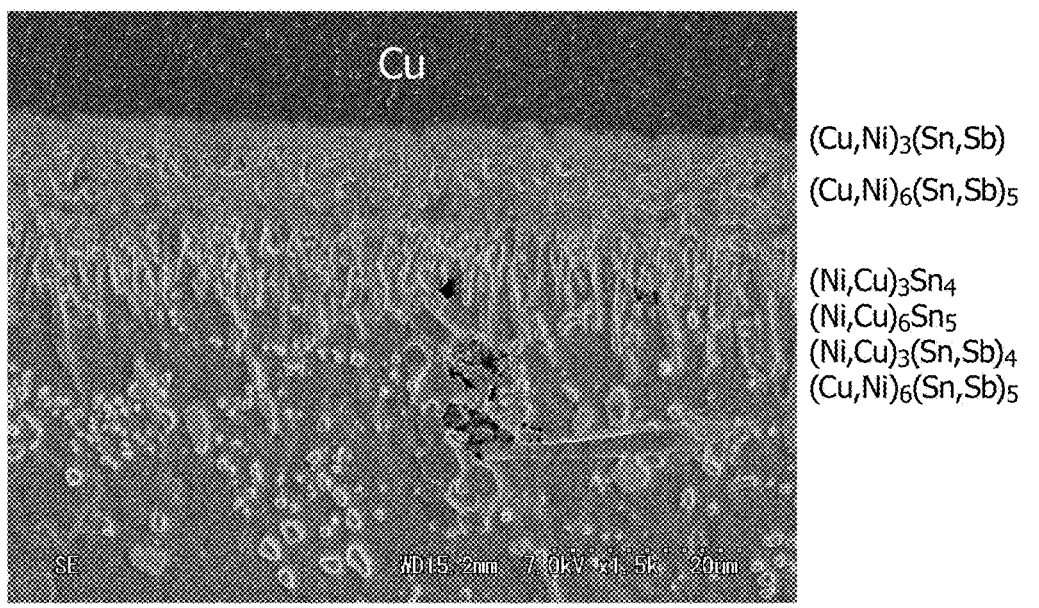
FIG. 7 is a photo of a solder joining layer near an interface of a joining cross-section according to an example with a Cu member, taken by a scanning electron microscope.
Figure 8:
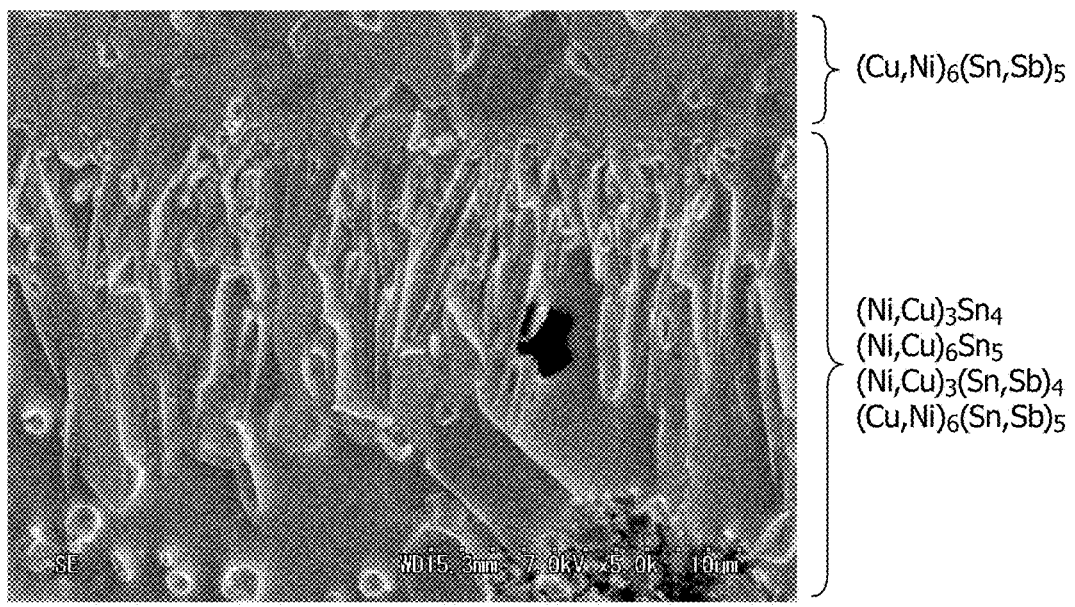
FIG. 8 is an enlarged diagram of the intermetallic compound structure portion in FIG. 7.

FIG. 7 illustrates a photo of a cross-section of the obtained joining taken by a scanning electron microscope. In FIG. 7, a thin layer of the $Cu_3(Sn, Sb)$ structure was observed at the interface of the solder joining layer 10 with the conductive plate 123 being the Cu member. Additionally, in contact with this, the particle-shaped first structure was observed. Most part of the first structure turned out to be $(Cu, Ni)_6(Sn, Sb)_5$ from the form thereof and composition analysis. In addition, the second structure was observed on the inner side of the solder joining layer 10 compared to the first structure, i.e. at a position distant from the interface. The second structure was in the shape of a needle or a pillar, and was present while being stacked on the first structure. The second structure included a large amount of $(Ni, Cu)_3(Sn, Sb)_4$ being an intermetallic compound containing Ni in a large amount. In addition, $(Ni, Cu)_3(Sn, Sb)$ and $(Ni, Cu)_3(Sn, Sb)_2$ were included. Furthermore, it turned out that $(Ni, Cu)_3Sn_4$ and $(Ni, Cu)_6Sn_5$ which did not contain Sb, and $(Cu, Ni)_6(Sn, Sb)_5$ being the main component of the first structure were also present. FIG. 8 is an enlarged photo of the second structure of FIG. 7. In FIG. 8, it was observed that many needle-shaped and pillar-shaped compounds had grown almost without spaces from the interface with the first structure toward the inner side of the solder joining layer with.

Figure 9B:
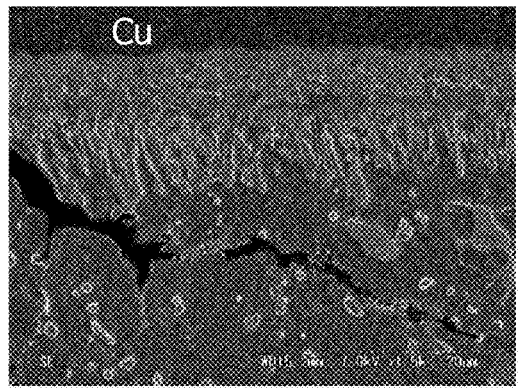
FIGS. 9A, 9B, and 9C are photos of a joining cross-section according to the example, taken by a scanning electron microscope.
Figure 9A:
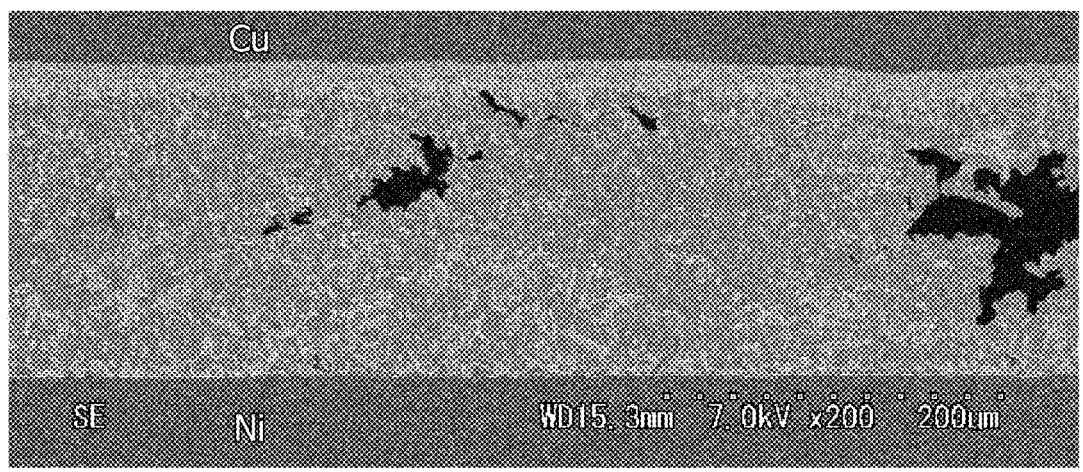
Figure 9C:
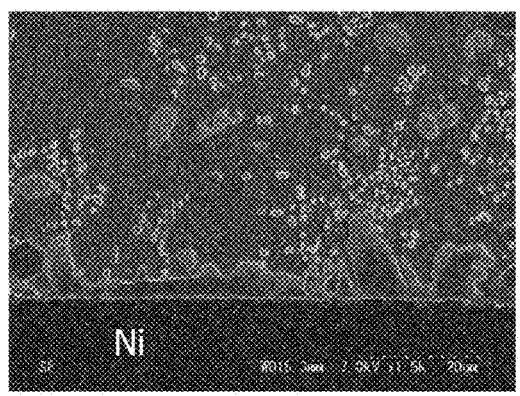

In FIG. 9A is a photo of the joining cross-section among the Ni member, the solder joining layer, and the Cu member, taken by a scanning electron microscope. FIG. 9B is an enlarged photo of the interface between the solder joining layer 10 and the conductive plate 12. As in the case of FIGS. 7 and 8, the particle-shaped first structure was observed near the interface and the needle-shaped second structure was observed on the inner side thereof in FIG. 9B. FIG. 9C is an enlarged photo of the interface between the solder joining layer 10 and the Ni member. In FIG. 9C, the needle-shaped compound was not observed at the interface of the solder joining layer 10 with the Ni member, but the NiSn or NiSb compound was observed. Interdiffusion between Ni and Sn produces the compound, and since the diffusion rate of Ni was slow, the NiSn or NiSb compound was considered to have grown at the interface at a slow rate. Referring again to (A), the needle-shaped compound was not observed on the inner side of the solder joining layer, but it was observed that $(Cu, Ni)_6Sn_5$ and $Ag_3(Sn, Sb)$ were crystallized in a sporadic manner.

Figure 10A:
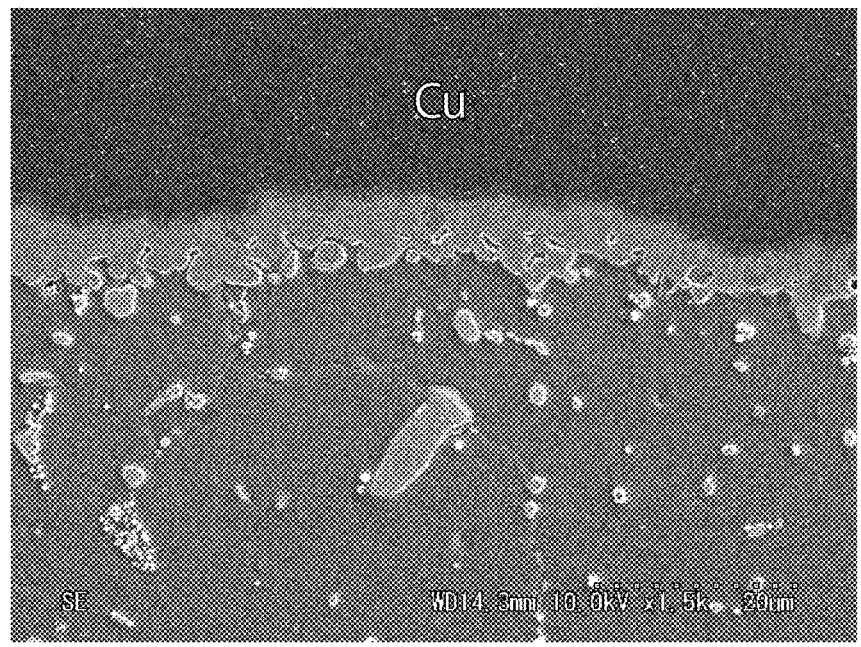
FIGS. 10A and 10B are photos of a solder joining layer near an interface of a joining cross-section according to a comparative example with a Cu member, taken by a scanning electron microscope.
Figure 10B:
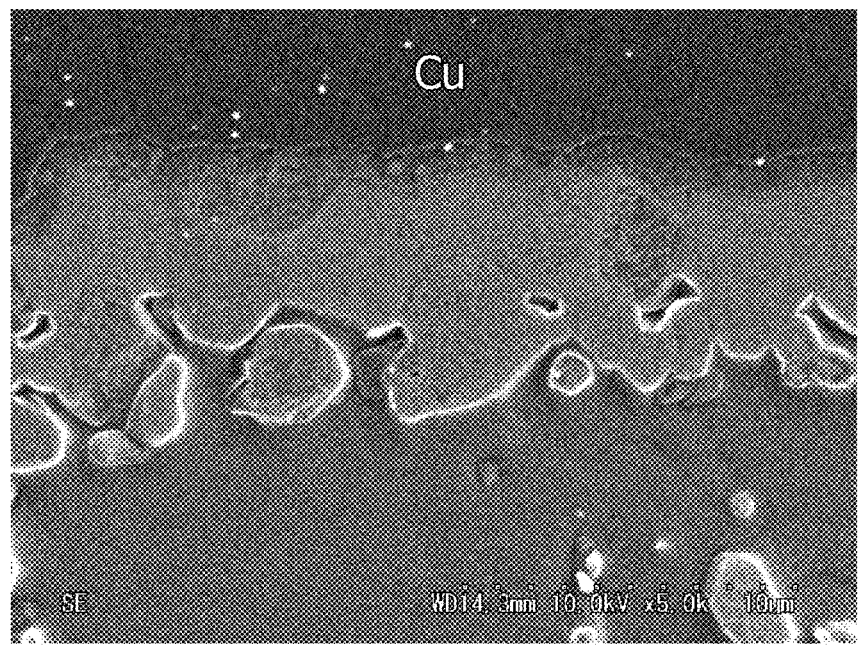

The joining of Comparative Example 1 was obtained in the same way as Example 1 except that the composition of the solder material was changed to Sn-5Sb solder indicated by sample number 1, in which 5% by mass of Sb and the balance of Sn were included. FIGS. 10A and 10B are photos showing the interface between the solder joining layer of the joining according to Comparative Example 1 and the Cu plate of the DCB substrate. Reference to FIG. 10A shows a compound structure of $Cu_3(Sn, Sb)$ in the joining layer in contact with the interface with the Cu member and $Cu_6(Sn,$ Sb)₅ being an intermetallic compound on the inner side thereof. Reference to FIG. 10B, which is an enlarged photo of FIG. 10A, shows that the compound was present near the interface in the form of a sequence of particles, and has a flat structure with small roughness. The characteristic structure construction of the present invention, in which the particle-shaped compound and the needle-shaped or the pillar-shaped compound were stacked, was not observed for the joining of the comparative examples.

(2) Embodiment of Fractured Joining

Figure 11A:
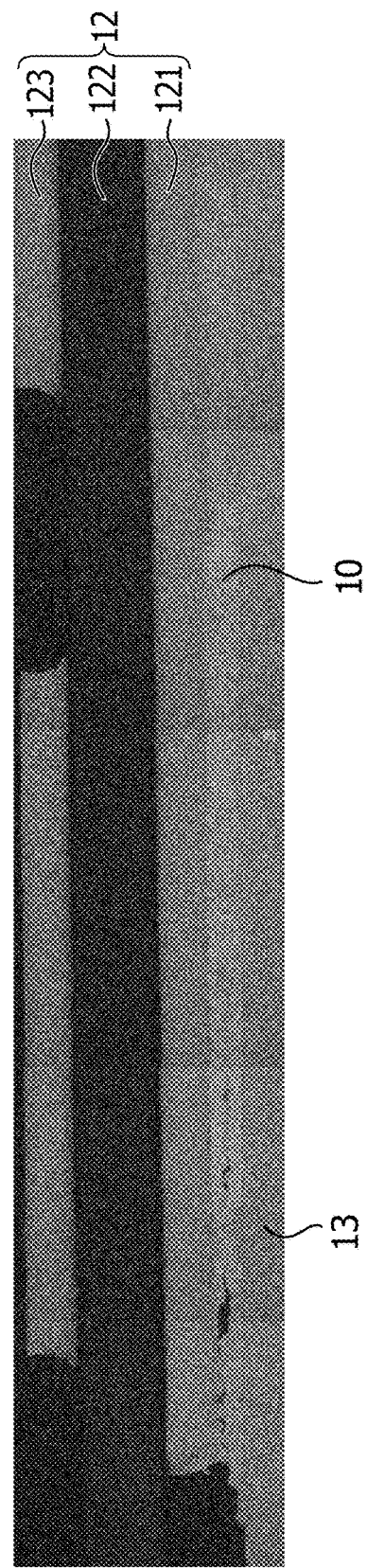
FIGS. 11A and 11B are photos of a cross-section of an embodiment of fractured joining according to an example and a comparative example.
Figure 11B:
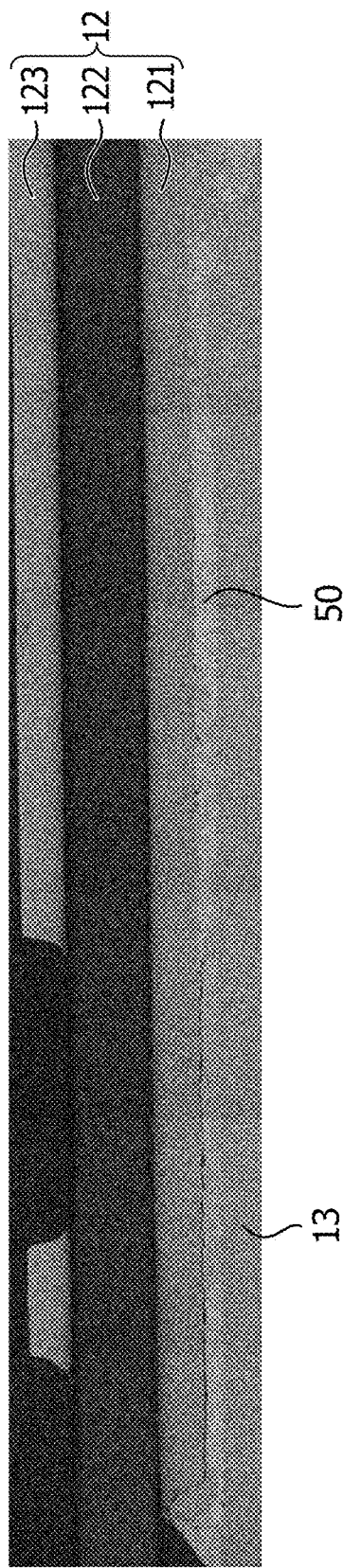

The joining of Example 2 was produced in the same way as (1) described above by using Sn-6Sb-4Ag-0.4Ni solder indicated by sample number 7 as the solder material and joining a conductive plate made of copper and a Ni-covered Cu plate together. In addition, the joining of Comparative Example 2 was produced in the same way as (1) described above except that the composition of the solder material was changed to Sn-9Sb-3Ag solder indicated by sample number 4, in which 9% by mass of Sb, 3% by mass of Ag and the balance of Sn were included. Each of the joinings was fractured in a thermal shock testing to be described later. The joining of Example 2 was fractured in 550 cycles and the joining of Comparative Example 2 was fractured in 100 cycles. FIG. 11A is a photo showing an embodiment of fractured joining according to Example 2 of the present invention. It is understood that a crack was propagated from an end portion of the solder joining layer 10. However, the joining did not peel off. The crack corresponded to a slight failure. In addition, no crack was observed at the interface of the DCB substrate with the Cu plate 121. FIG. 11B is a photo showing an embodiment of fractured joining according to Comparative Example 2. It is understood that a crack was produced and there was peeling over an extended region at the interface between the solder joining layer 50 and the Cu plate 121 of the DCB substrate. This peeling was a serious failure of the device.

Figure 12A:
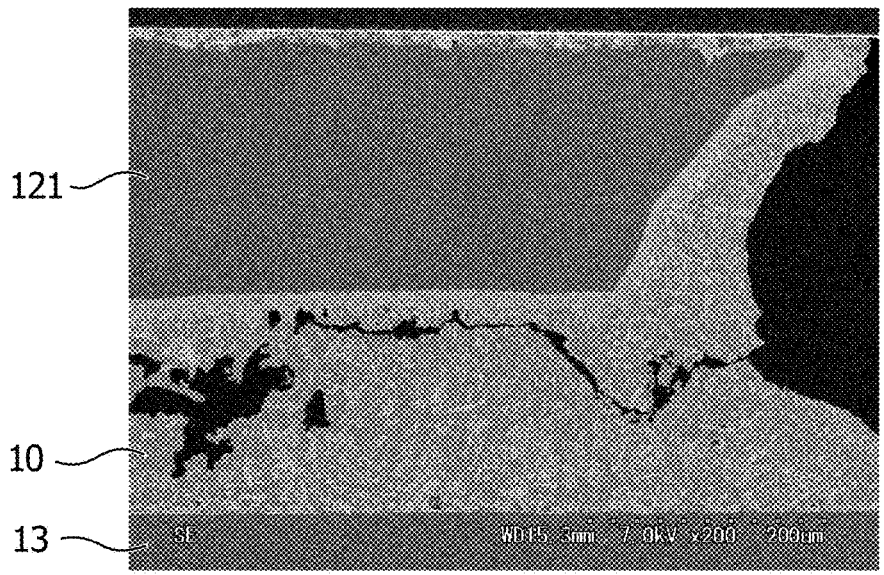
FIGS. 12A and 12B are enlarged photos of an end portion of the solder joining layer of the joining in FIGS. 11A and 11B.

FIG. 12A is an enlarged photo of the end portion of the solder joining layer of the FIG. 11A. It is understood from this enlarged photo that the fracture occurred because the origin of the crack was located at the end portion of the solder joining layer not at the interface with the Cu plate. In the case of the fracture mode of Example 2, the crack only occurred locally. Since the crack was difficult to extend, the reliability as a device was high compared to Comparative Example 2. In addition, while the first structure and the second structure were observed at the interface of the solder joining layer with the Cu plate, no needle-shaped or pillar-shaped structure was observed at the interface with the Ni member. Without wishing to be bound by theory, this is considered to be the result that the first structure and the second structure shown in FIGS. 7 and 8 distributed the concentrated stress at the interface between different materials, for example.

Figure 12B:
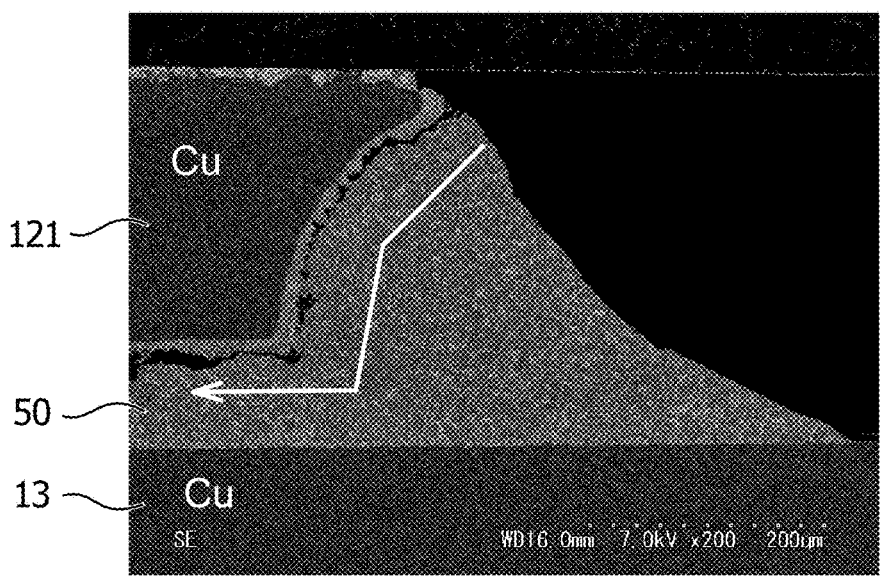

On the other hand, FIG. 12B is an enlarged photo at the end portion of the solder joining layer 50 of FIG. 11B. It is understood from this photo that the peeling due to the crack occurred along the interface between the solder joining layer 50 and the Cu plate 121 of the DCB substrate. Additionally, it was confirmed that this peeling was produced from the interface between the solder structure and the intermetallic compound produced at the interface with the Cu plate. As described above, extension of a crack is a fatal fault for the device. Cu is about ten times harder than Sn, and the intermetallic compound is about four times harder than Cu. Since a hard object has a low deformability when a certain stress strain is applied thereon, a strain occurs at the interface between different materials of different hardness, and the larger the difference in hardness, the larger the strain produced.

(3) Heat Resistance Evaluation

The joinings of the examples and the comparative examples were fabricated to evaluate the heat resistance. Regarding the heat resistance evaluation, the evaluation was performed by thermal shock testing and high temperature retention testing. In both the thermal shock testing and the high temperature retention testing, the evaluation criteria were whether or not there were white dots when observed from the DCB substrate side and whether or not there was a crack in an SEM cross-section. Observation of a cross-section with white dot portions shows a crack as in FIG. 12B. Determination was made that it was defective if there was a crack as in FIG. 12B.

[Thermal Shock Testing]

Test samples of Examples 3-1 to 3-12 and Comparative Examples 3-1 to 3-5 were fabricated by using solder materials of sample numbers 1 to 17 shown in Table 1 and joining a DCB substrate and a heat sink plate made of copper. To be more specific, a square plate solder having a side of 9.5 mm and a thickness of 0.25 mm was placed on the DCB substrate, a heat sink plate was placed thereon, and the stack was joined by heating under an $H_2$ reducing atmosphere at 300° C. for 3 minutes.

Figure 13A:
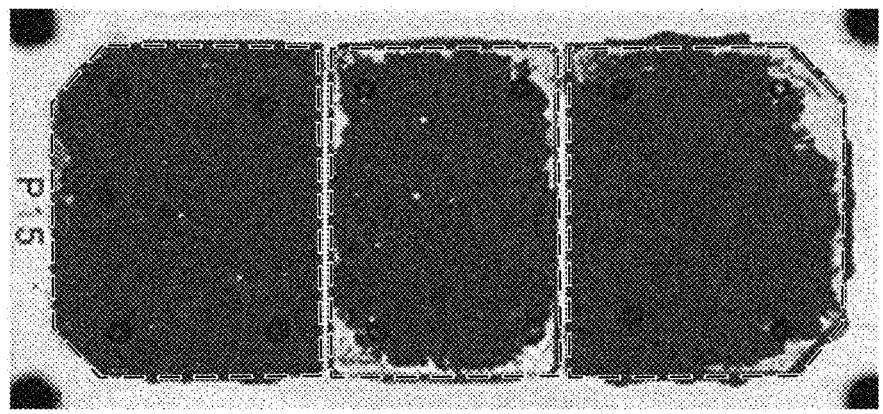
FIGS. 13A, 13B, and 13C are photos taken by an ultrasonic testing microscope, showing a result of thermal shock testing.
Figure 13B:
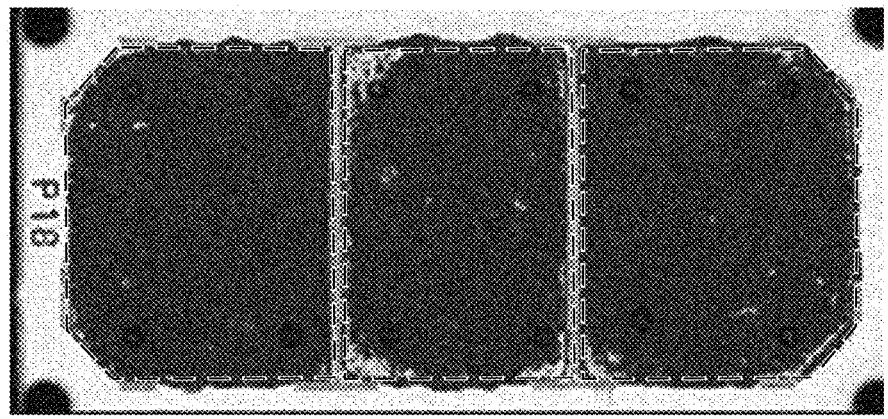
Figure 13C:
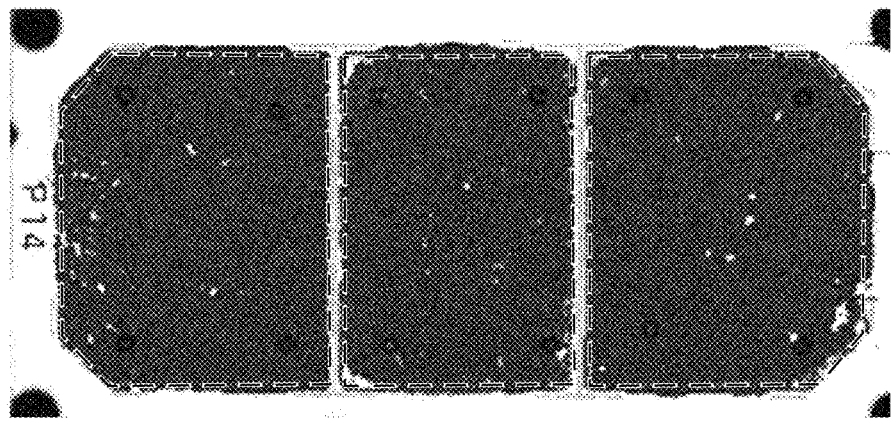

The thermal shock testing was carried out as a solder heat resistance evaluation. Three hundred cycles were performed under the test conditions that the joining was retained at −45° C. to 155° C. for 10 minutes and that 1 cycle was counted as −45° C. retention and retention at 155° C. for 10 minutes. Next, peeling of the solder joining or the occurrence of a crack was confirmed using an ultrasonic testing microscope. Table 2 shows the results of the thermal shock testing by the evaluation criteria described above. In addition, regarding the joining of a representative solder material composition, FIGS. 13A, 13B, and 13C illustrates a photo after the thermal shock testing, taken by a microscope. FIG. 13A is a photo of the joining of Comparative Example 3-1 employing a Sn-5Sb solder material of sample number 1, (B) is a photo of the joining of Comparative Example 3-3 employing a Sn-6Sb-4Ag solder material of sample number 3, and (C) is a photo of the joining of Example 3-2 employing a Sn-6Sb-4Ag-0.4Ni solder of sample number 7. The black regions illustrated in the figures each are a solder joining and white dots each are cracks, in other words a portion where a solder fracture occurred. Crack determination states that a sample which has a number of white dots within the early solder joining area indicated by dotted frames has a reduced cooling performance and a reduced solder joining strength. To sum up, the sample having fewer white dots as much as possible shows an excellent characteristic. Note that the white dots observed in the central portion and the like of the microscope photo of each sample were voids present prior to the test, not portions where solder was fractured due to the thermal shock testing. FIGS. 13A, 13B, and 13C show that the samples were excellent in heat resistance in the order of Example 3-2, Comparative Example 3-3, and Comparative Example 3-1 and that addition of Ni improves service life.

[High Temperature Retention Testing]

Figure 14A:
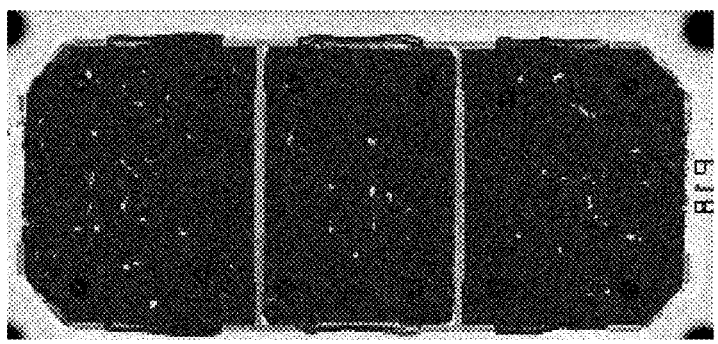
FIGS. 14A, 14B, 14C, and 14D are photos taken by an ultrasonic testing microscope, showing a result of high temperature retention testing.
Figure 14B:
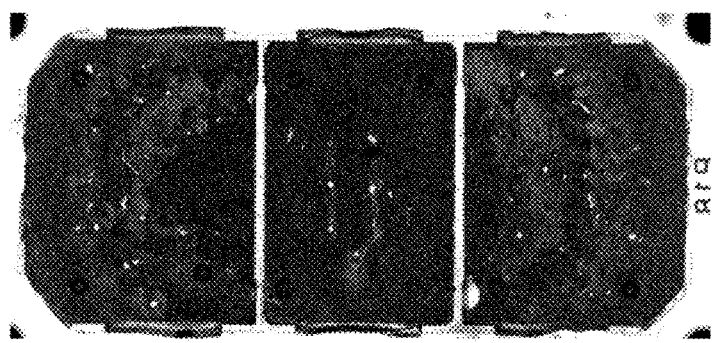
Figure 14C:
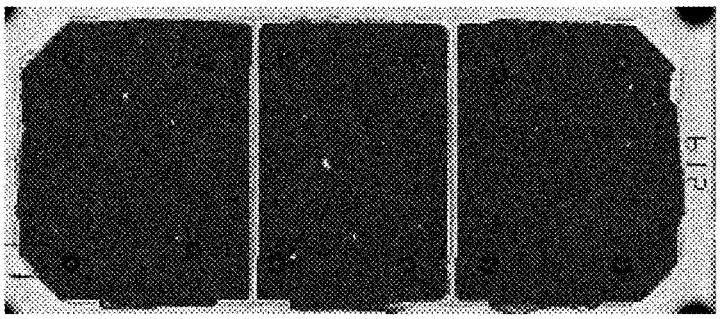
Figure 14D:
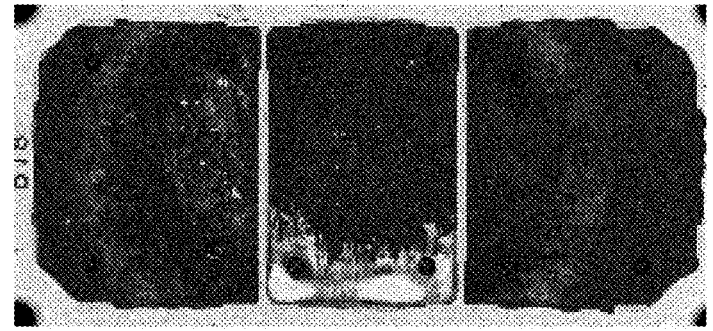

Test samples of Examples 3-1 to 3-12 and Comparative Examples 3-1 to 3-5 were fabricated by using solder materials of sample numbers 1 to 17 shown in Table 1 under the same conditions as the thermal shock testing. These samples were put in a thermostatic chamber at 175° C. and were retained for 300 hours. An ultrasonic testing microscope was used to check if there was peeling due to a crack in the solder joining when the samples were put and after retention of 300 hours. Table 2 shows the results of high temperature retention testing with the evaluation criteria described above. In addition, regarding the joining of a representative solder material composition, FIGS. 14A, 14B, 14C, and 14D illustrates photos after the high temperature retention testing, taken by an ultrasonic testing microscope. FIG. 14A is a photo of the sample of Example 3-2 employing the solder material of sample number 7 when put in the thermostatic chamber, FIG. 14B is a photo of the sample of Example 3-2 after 300 hours, FIG. 14C is a photo of the sample of Comparative Example 3-1 employing the solder material of sample number 1 when put in the thermostatic chamber, and FIG. 14D is a photo of the sample of Comparative Example 3-1 after 300 hours. The black regions in the photos each are a solder joining and white dots each are a portion where a solder fracture occurred. Crack determination states that a sample which has a number of white dots within the early solder joining area has a reduced cooling performance and a reduced solder joining strength. The sample having fewer white dots, in other words the sample where no solder fracture occurred, shows excellent characteristics. In the sample of Example 3-2, no white dots attributed to solder fracture were observed even after 300 hours. On the other hand, in the sample of Comparative Example 3-1, peeling was clearly observed.

At high temperatures, it is generally said that the intermetallic compound produced at the joining interface between the solder joining layer and the Cu electrode grows in accordance with the Arrhenius law, and the growth is accelerated depending on the temperature and time. In general, in a joining retained at a high temperature, an intermetallic compound grows and thermal stress produced at the interface between different materials cannot be released. As a result, there may be a peeling between the compound which has grown to a large extent and the solder, leading to a fracture. In the Sn-5Sb solder, the growth of an interface compound is observed attributed to interdiffusion of Cu and Sn. As a result, in the present experiment, the interface turns white and peeling occurred after 300 hours. On the other hand, in the solder composition added with Ni, it was observed that there were no clear white regions and no peeling occurred. A possible reason for this is that in a Ni-added product, the presence of compounds such as CuNiSn and NiCuSn and the production of a needle-shaped compound release the concentration of strain at the interface between different materials, providing an effect of delaying a fracture due to thermal stress.

TABLE 2

| Sample Number | | Composition | Result of Thermal Shock Testing | Result of High Temperature Retention Testing |
|---|---|---|---|---|
| Comparative Example 3-1 | 1 | Sn—5Sb | Defective | Defective |
| Comparative Example 3-2 | 2 | Sn—7Sb—2Ag | Defective | Defective |
| Comparative Example 3-3 | 3 | Sn—6Sb—4Ag | Defective | Defective |
| Comparative Example 3-4 | 4 | Sn—9Sb—3Ag | Defective | Defective |
| Comparative Example 3-5 | 5 | Sn—6Sb—4Ag—2.0Ni | Defective | Good |
| Example 1 | 6 | Sn—6Sb—4Ag—1.0Ni | Good | Good |
| Example 2 | 7 | Sn—6Sb—4Ag—0.4Ni | Good | Good |
| Example 3 | 8 | Sn—6Sb—4Ag—0.01Ni | Good | Good |
| Example 4 | 9 | Sn—6Sb—4Ag—0.01Ni—0.001Ge | Good | Good |
| Example 5 | 10 | Sn—6Sb—4Ag—0.01Ni—0.05Ge | Good | Good |
| Example 6 | 11 | Sn—6Sb—4Ag—0.5Ni—0.001Ge | Good | Good |
| Example 7 | 12 | Sn—6Sb—4Ag—0.5Ni-0.05 Ge | Good | Good |
| Example 8 | 13 | Sn—6Sb—4Ag—0.01Ni—0.1Cu | Good | Good |
| Example 9 | 14 | Sn—6Sb—4Ag—0.01Ni—0.9Cu | Good | Good |
| Example 10 | 15 | Sn—6Sb—4Ag—0.5Ni—0.1Cu | Good | Good |
| Example 11 | 16 | Sn—6Sb—4Ag—0.5Ni—0.9Cu | Good | Good |
| Example 12 | 17 | Sn—6Sb—4Ag—0.01Ni—0.1Cu—0.05Ge | Good | Good |

The present invention may be used in a joining of e.g. a semiconductor chip in a general high current electronic device, and is preferably used in a packaging component such as an IC in particular. The present invention is also preferably used in a die bonding joining of a component that emits a large amount of heat such as an LED element and a power semiconductor device such as a power diode, and further in a die bond joining for internal connection such as an IC element in a general electronic component mounted on e.g. a printed circuit board.

REFERENCE SYMBOL LIST

1 first structure
2 second structure
3 $Cu_3(Sn, Sb)$ structure
4 intermetallic compound
5 solder
10 solder joining layer
11 semiconductor element
12 laminate substrate
121 conductive plate
122 insulating substrate
123 conductive plate
13 heat sink
14 aluminum wire
15 external terminal
16 case
17 resin sealant
50 solder joining layer
100 power module

The invention claimed is:

1. A solder joining structure, comprising:
   a solder joining layer having a melted solder material, comprising
   more than 5.0% by mass and 10.0% by mass or less of Sb,
   2.0 to 4.0% by mass of Ag,
   more than 0 and 1.0% by mass or less of Ni, and
   a balance made up of Sn and inevitable impurities; and
   joining members at least one of which is a Cu or Cu-alloy member, wherein
   the solder joining layer includes a first structure containing $(Cu, Ni)_6(Sn, Sb)_5$ and a second structure containing $(Ni, Cu)_3(Sn, Sb)_x$ (wherein, X is 1, 2, or 4) at an interface with the Cu or Cu-alloy member.

2. The solder joining structure according to claim 1, wherein
   the solder material further comprises 0.001 to 0.1% by mass of Ge.

3. The solder joining structure according to claim 1, wherein
   the solder material further comprises more than 0 and 1.2% by mass or less of Cu.

4. The solder joining structure according to claim 2, wherein
   the solder material further comprises more than 0 and 1.2% by mass or less of Cu.

5. The solder joining structure according to claim 1, wherein
   the solder material further comprises 0.001 to 0.1% by mass of P.

6. The solder joining structure according to claim 2, wherein
   the solder material further comprises 0.001 to 0.1% by mass of P.

7. The solder joining structure according to claim 3, wherein
   the solder material further comprises 0.001 to 0.1% by mass of P.

8. The solder joining structure according to claim 4, wherein
   the solder material further comprises 0.001 to 0.1% by mass of P.

9. The solder joining structure according to claim 1, wherein
   Ni of the solder material is partially substituted with one or more elements selected from Pt, Pd, and Rh.

10. The solder joining structure according to claim 1, wherein
    a content of the Ni of the solder material is 0.1 to 0.4% by mass, or
    Ni of the solder material is partially substituted with one or more elements selected from Pt, Pd, and Rh and a total content of Ni and the one or more elements selected from Pt, Pd, and Rh is 0.1 to 0.4% by mass.

11. The solder joining structure according to claim 1, wherein
    the first structure is a particle-shaped compound, and the second structure is a needle-shaped compound or a pillar-shaped compound.

12. The solder joining structure according to claim 1, wherein
    the first structure is distributed at an interface of the solder joining layer with the Cu or Cu-alloy member, and
    the second structure is in contact with the first structure and is distributed on an inner side of the first structure which faces away from the interface.

13. An electronic device comprising the solder joining structure according to claim 1.

14. A semiconductor device comprising the solder joining structure according to claim 1.

15. The solder joining structure according to claim 2, wherein the first structure is a particle-shaped compound, and the second structure is a needle-shaped compound or a pillar-shaped compound.

16. The solder joining structure according to claim 3, wherein the first structure is a particle-shaped compound, and the second structure is a needle-shaped compound or a pillar-shaped compound.

17. The solder joining structure according to claim 2, wherein
    the first structure is distributed at an interface of the solder joining layer with the Cu or Cu-alloy member, and
    the second structure is in contact with the first structure and is distributed on an inner side of the first structure which faces away from the interface.

18. The solder joining structure according to claim 3, wherein
    the first structure is distributed at an interface of the solder joining layer with the Cu or Cu-alloy member, and
    the second structure is in contact with the first structure and is distributed on an inner side of the first structure which faces away from the interface.

19. An electronic device comprising the solder joining structure according to claim 2.

20. An electronic device comprising the solder joining structure according to claim 3.

* * * * *